United States Patent
Heineke et al.

(10) Patent No.: US 6,673,645 B2
(45) Date of Patent: Jan. 6, 2004

(54) METHOD AND APPARATUS FOR A MONOLITHIC INTEGRATED MESFET AND P-I-N OPTICAL RECEIVER

(75) Inventors: Randolph B. Heineke, Rochester, MI (US); William K. Hogan, Rochester, MI (US); Scott Allen Olson, Rochester, MI (US); Clint Lee Schow, Rochester, MI (US)

(73) Assignee: International Business Machines Corporation, Armonk, NY (US)

(*) Notice: Subject to any disclaimer, the term of this patent is extended or adjusted under 35 U.S.C. 154(b) by 50 days.

(21) Appl. No.: 10/142,093

(22) Filed: May 8, 2002

(65) Prior Publication Data

US 2002/0130336 A1 Sep. 19, 2002

Related U.S. Application Data

(62) Division of application No. 09/573,748, filed on May 18, 2000, now Pat. No. 6,429,499.

(51) Int. Cl.[7] .............................................. H01L 21/00
(52) U.S. Cl. ........................ 438/59; 438/60; 438/167; 438/174; 438/184; 438/185
(58) Field of Search ........................... 438/57, 59, 60, 438/167, 174, 184, 185

(56) References Cited

U.S. PATENT DOCUMENTS

| | | | |
|---|---|---|---|
| 5,357,127 A | 10/1994 | Park et al. | 257/189 |
| 5,598,022 A * | 1/1997 | Kyomasu | 257/458 |
| 5,818,096 A | 10/1998 | Ishibashi et al. | 257/458 |
| 5,837,574 A * | 11/1998 | Bergemont et al. | 438/239 |
| 6,051,471 A | 4/2000 | Gardner et al. | 438/286 |
| 6,100,551 A * | 8/2000 | Lee et al. | 257/232 |
| 6,184,055 B1 * | 2/2001 | Yang et al. | 438/57 |

FOREIGN PATENT DOCUMENTS

WO    WO 94/28582 A1 * 12/1994

OTHER PUBLICATIONS

S. Tiwari, et al., "Lateral p–i–n Photodectectors with 18 GHz Band width at 1.3 μm Wavelength and Small Bias Voltages", IBM Research Division, IBM Thomas J. Watson Research Center, Yorktown Heights, New York, pp. 1–4.

J.N. Haralson II, et al., "Theoretical Study of a GaAs Lateral p–i–n Photodetector", Applied Physics Letters, vol. 72, No. 13, Mar. 30, 1998, pp. 1641–1643.

* cited by examiner

*Primary Examiner*—Eddie Lee
*Assistant Examiner*—Paul E Brock, II
(74) *Attorney, Agent, or Firm*—Konrad Raynes Victor & Mann, LLP; David W. Victor

(57) ABSTRACT

Disclosed is a semiconductor structure and manufacturing process for making an integrated FET and photodetector optical receiver on a semiconductor substrate. A FET is formed by forming at least one p channel in a p-well of the substrate and forming at least one n channel in the p-well of the substrate. A p-i-n photodetector is formed in the substrate by forming at least one p channel in an absorption region of the substrate when forming the at least one p channel in the p well of the FET and forming at least one n channel in the absorption region of the substrate when forming the at least one n channel in the p-well of the FET.

8 Claims, 5 Drawing Sheets

METHOD AND APPARATUS FOR A MONOLITHIC INTEGRATED MESFET AND P-I-N OPTICAL RECEIVER

This application is a divisional of U.S. patent application Ser. No. 09/573,748 filed May 18, 2000 now U.S. Pat. No. 6,429,499, which is incorporated herein by reference in its entirety.

BACKGROUND OF THE INVENTION

1. Field of the Invention

The present invention relates to a method of forming an integrated MOSFET and p-i-n optical receiver.

2. Description of the Related Art

Optoelectronic integrated circuits (OEIC), which may often consist if a p-i-n (PIN) photodector and field effect transistor (FET), are commonly used in high speed digital optical communication systems. One goal in designing an integrated photodetector and transistor, is to design a structure that optimizes the manufacturing process of the two elements, photodetector and transistor. Another goal is to optimize bandwidth in the photodetector and, at the same time, the responsiveness of the photodetector to light. In photodector design, a trade-off is made between capacitance and the speed or bandwidth of transmissions in the photodetector. Another goal is to operate at low supply voltages while maintaining a high bandwidth. Thus, there is a need in the art for a structure and manufacturing process for an improved monolithic lateral integrated transistor and photodetector that maintains a relatively high bandwidth, high responsivity of the photodetector to light, and that is capable of operating at low supply voltages.

SUMMARY OF THE PREFERRED EMBODIMENTS

To overcome the limitations in the prior art described above, preferred embodiments disclose a semiconductor structure and manufacturing process for making an integrated field effect transistor (FET) and photodetector optical receiver on a semiconductor substrate. The FET is formed by forming at least one p channel in a p-well of the substrate and forming at least one n channel in the p-well of the substrate. A p-i-n photodetector is formed in the substrate by forming at least one p channel in an absorption region of the substrate when forming the at least one p channel in the p well of the FET and forming at least one n channel in the absorption region of the substrate when forming the at least one n channel in the p-well of the FET.

Preferred embodiments provide an improved technique for producing a monolithically integrated optical receiver in which the photodetector and preamplifier circuit share a common substrate. Monolithic integration is advantageous over hybrid integration, in which the photo-detector and amplifier circuits are fabricated separately and then interconnected as the cost of manufacturing is less, the yield is higher, and the performance is improved due to a reduction in packaging parasitics. Further, preferred embodiments allow the production of an integrated amplifier and optical receiver that can be used in high speed communication and, at the same time, is capable of operation at low supply voltages.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1A:
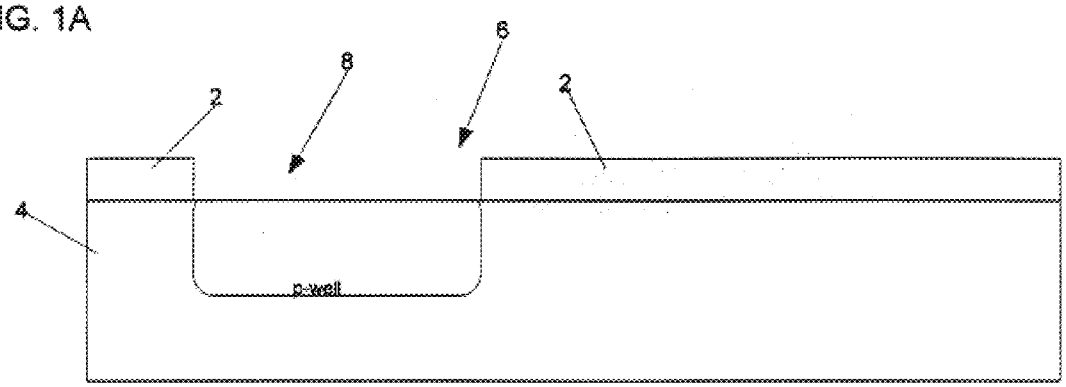
FIGS. 1A through 1I show cross-sectional views of successive process steps for making an integrated p-i-n photodetector and metal semiconductor field effect transistor (MESFET) in accordance with an embodiment of the invention.

In the following description, reference is made to the accompanying drawings which form a part hereof and which illustrate several embodiments of the present invention. In the drawings, depicted elements are not necessarily drawn to scale and like or similar elements may be designated by the same reference numeral throughout the several views. Further, it is understood that other embodiments may be utilized and structural and operational changes may be made without departing from the scope of the present invention.

In FIG. 1A, a photoresist 2 is deposited as a continuous layer on an undoped gallium arsenide semi-insulating (GaAs-SI) substrate 4. The photoresist is selectively irradiated using a photo lithographic system, such as a step and repeat optical projection system to remove an opening 6 in the photoresist 2 using a mask. A P-region is implanted into the substrate 4 to form the p-well 8, in which the MESFET portion of the monolithic MESFET and PIN photodetector is formed.

Figure 1B:
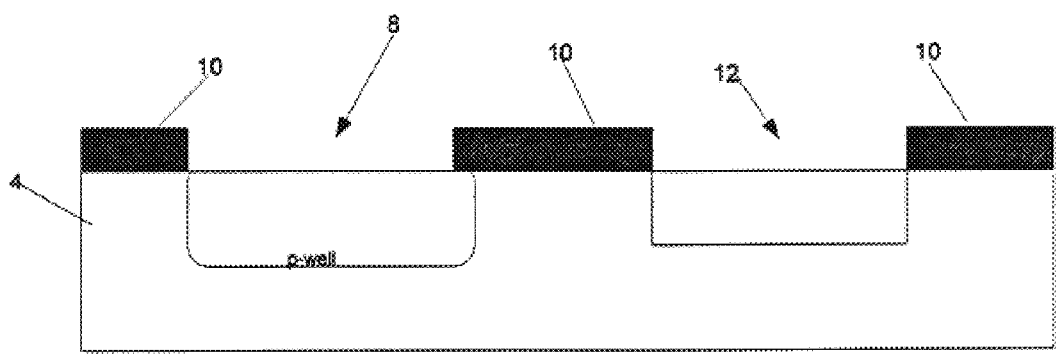

In FIG. 1B, a field oxide (FOX) 10 is deposited in non-active regions of the substrate 4, thereby exposing the active regions 8 and 12 for the FET and the p-i-n photodetector.

Figure 1C:
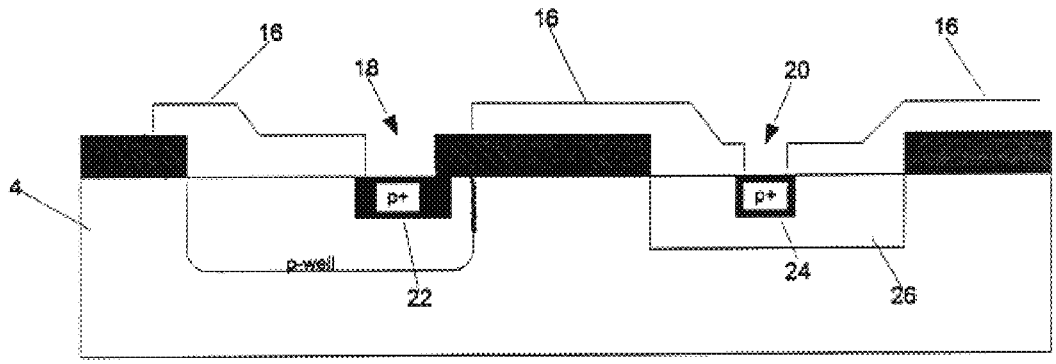

In FIG. 1C, a photoresist layer 16 is formed on the substrate to cover the inactive and active regions. The photoresist 16 is irradiated and portions of the irradiated photoresist 16 are removed using a mask and etchings to form openings 18 and 20 for p+ implants 22 and 24 in the FET and p-i-n regions of the substrate 4. The active region 12 includes an absorption region 26 where the dopings to the p-i-n photodetector occur. Zinc (Zn) or Beryllium (Be) may be used for the p+ dopings at this step.

Figure 1D:
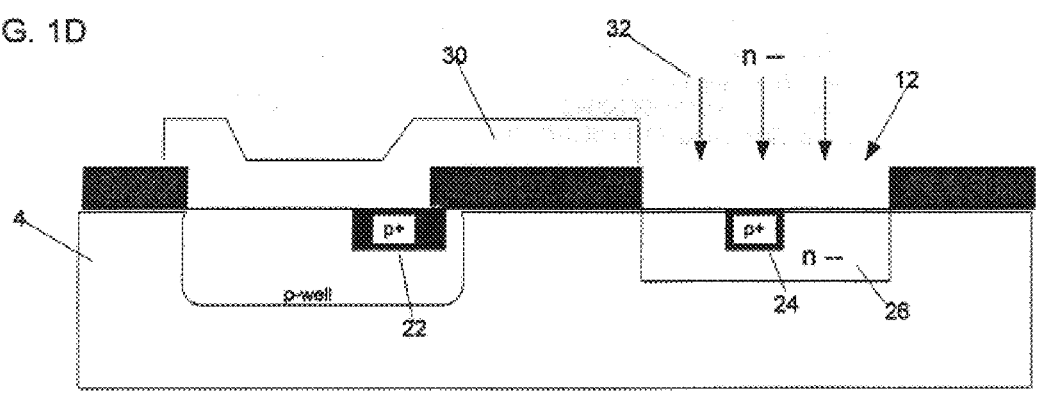

In FIG. 1D, a photoresist layer 30 is formed on the substrate 4, which is then irradiated and etched using a mask to expose a section of the absorption region 26 of the p-i-n photo-conductor region. A low dose of n--32, shown by the downward arrows, is implanted in the absorption region 26 to convert the absorption region 26 to a low dose n--region.

Figure 1E:
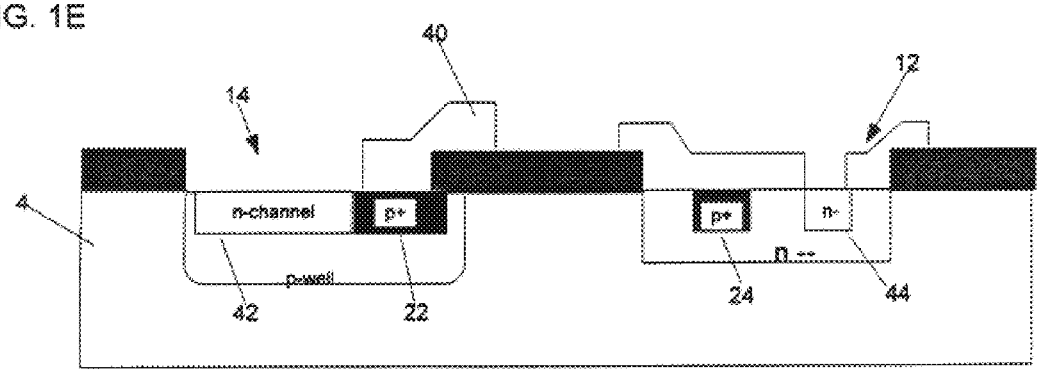

In FIG. 1E, photoresist layer 40 is formed on the substrate 4, which is then irradiated and irradiated portions etched away using a mask to expose openings in the active regions 12 and 14 to receive the n-implant, leaving the p+ channels 22 and 24 covered. The n-doping forms n-type implants 42 and 44 in the upper area of the p-well and the absorption region, respectively. This n-doping increases the threshold of the FET device.

Figure 1F:
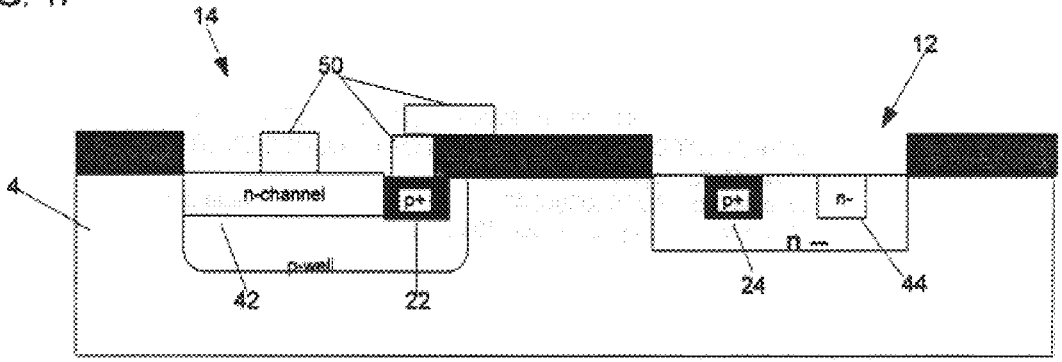

In FIG. 1F, metal gates 50 are deposited in the FET region 14. In certain embodiments, metal gates are not placed in the p-i-n region 12 in order to optimize the responsiveness of the p-i-n photodetector, because the use of metal gates can reduce the responsiveness of the p-i-n photodetector by reflecting light away from the photodetector sensor. In alternative embodiments, metal gates may be deposited above the implanted n– and p+ channels of the p-i-n photodetector to reduce resistance and increase the bandwidth in the p-i-n. The deposition of the metal gates 50 above the n channel 42 produces two n channels or fingers 42a, b in the FET region 14, as shown in FIG. 1G.

Figure 1G:
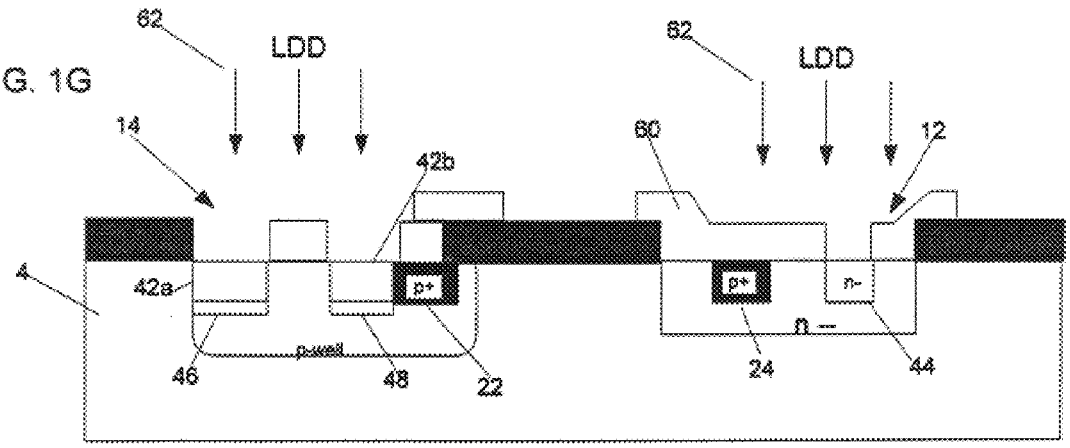

In FIG. 1G, photoresist 60 is deposited, irradiated, and etched away using a mask to expose the n channel in the p-i-n region 12 and the n channels 42a, b in the FET region 14. A lightly doped drain (LDD) 62 is then implanted over the n– channels 42a, b in the FET region 12 as shown as LDD regions 46 and 48. This LDD doping improves the performance of the FET. The LDD doping has little effect on the n-channel 44 in the p-i-n region 12.

Figure 1H:
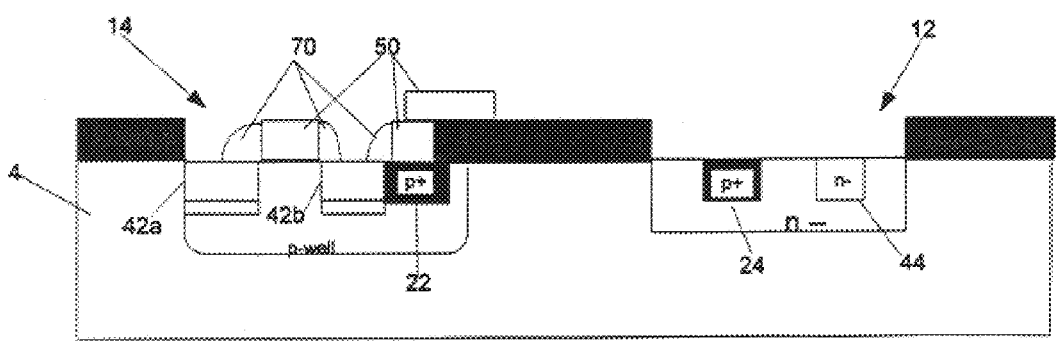

In FIG. 1H, spacers 70 are added to the metal gates 50 in the FET region 14. The spacers 70 may be formed using known techniques in the art, such as by etching an oxide deposited over the metal gates 50.

Figure 1I:
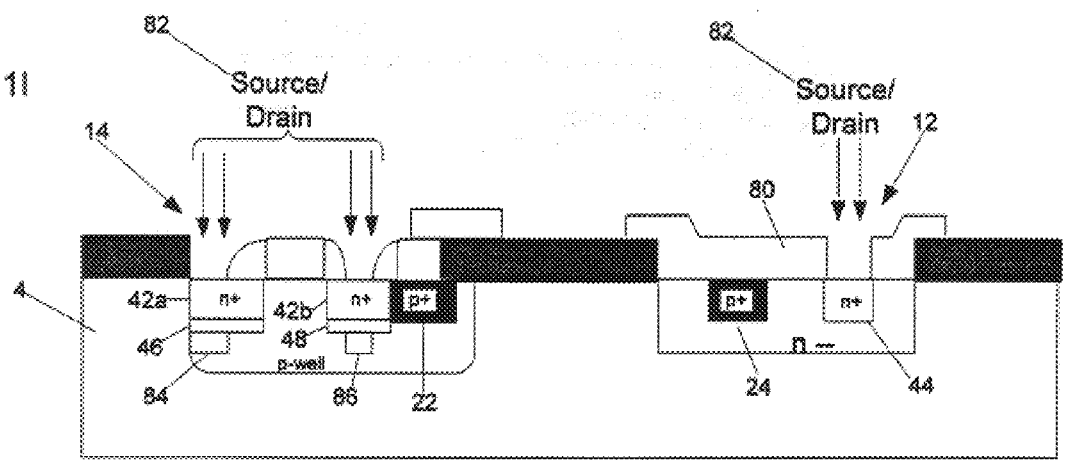

In FIG. 1I, photoresist 80 is applied to the p-i-n region 12 and portions are irradiated and etched away using a mask to expose the n– channel 44 as well as the channels 42a, b in the FET region 14. A heavy n+ source/drain region 82, shown by the downward arrows, is implanted into the n– finger 44 of the p-i-n region to convert the n– channels 44 to n+ channels. The heavy n+ source/drain is implanted over the n-region 42a, b and LDD regions 46, 48 of the n channels in the FET region 14 into the region 84 and 86, respectively.

Figure 2A:
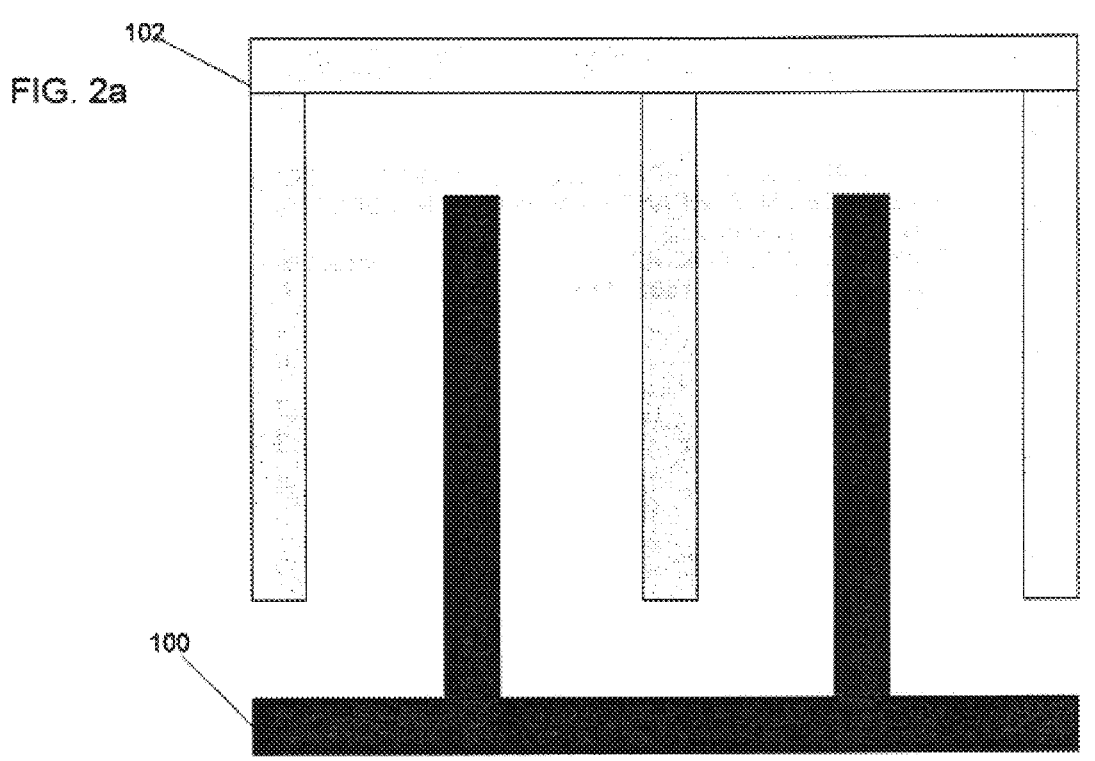
FIGS. 2A and 2B show top-down perspective views of channels formed in the p-i-n photodetector in accordance with preferred embodiments of the present invention.
Figure 2B:
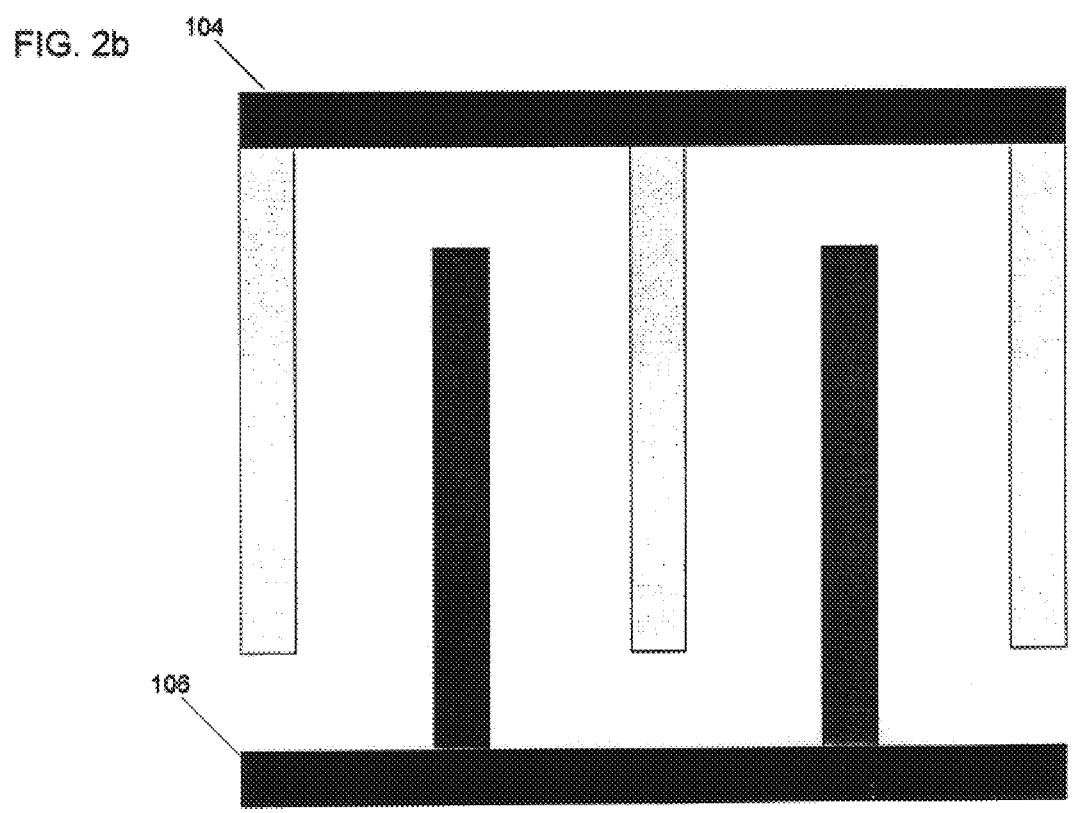

FIG. 2a illustrates illustrate a top-down view of the n+ 24 and p+ 44 channels in the p-i-n photodetector region 12 in which interconnected n+ 100 and p+ 102 type channels are formed having vertical finger channels interconnected by a horizontal bar. After the process in FIG. 1I, the fingers of the p+ 24 and n+ may be metalized on the edges to connect the finger regions. FIG. 2b illustrates how the horizontal bar region of the channel 100 and 102 formations may be metalized by depositing a metal 104 and 106 on the horizontal bars. In alternative embodiments, to maximize the responsivity of the p-i-n photodetector, the channels 100 and 102 would not be metalized because the metal in the p-i-n region 14 could deflect light and thereby degrade responsivity. However, adding the metalized regions in the channels 100 and 102 reduces resistance and may improve the bandwidth of the photodetector.

The end-result of the above described process is a monolithic lateral integrated MESFET and p-i-n photodetector grown on a gallium arsenide (GaAs) substrate. The preferred embodiment semiconductor process described herein forms a monolithic integrated optical receiver in which the photodetector and preamplifier circuit share a common substrate. In preferred embodiments, the p-i-n photodetector is formed by alternately implanting n+ and p+ doped regions into an undoped GaAs substrate. The process for producing the integrated receiver structure described herein is compatible with existing GaAs MESFET transistor fabrication processes and does not require additional processing procedures. The monolithic integrated transimpedence MESFET amplifier and p-i-n photodetector may be formed using other planar MESFET or HEMT transistor processes.

The preferred embodiments are particularly suited for fabricating n and p channel MOSFETs integrated with a p-i-n photodector. Although only a single pair of N channel and P channel devices has been shown for purposes of illustration, it is understood that in actual practice many devices are fabricated on a single semiconductor wafer as widely practiced in the art. Accordingly, the invention is well suited for use in integrated circuit chip, as well as an electronic system including a microprocessor, a memory and a system bus.

Moreover, preferred embodiments allow the production of an integrated amplifier and optical receiver that can be used in high speed communication and is capable of operation at low supply voltages. For instance, the integrated amplifier and optical receiver of the preferred embodiments is capable of operating at supply voltages lower than 5 V and at bit-rates greater than 2.5 gigabits per second.

In alternative embodiments, certain of the n dopings, such as the LDD doping in FIG. 1G and n--doping in FIG. 1E may not be performed in lieu of a single n+ heavy source/drain doping of FIG. 1I.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an integrated field effect transistor (FET) and photodetector optical receiver, comprising:

providing a semiconductor substrate;
forming a FET, including:
    forming at least one p channel in a p-well of the substrate;
    forming at least one n channel in the p-well of the substrate;
forming a p-i-n photodetector in the substrate, including:
    forming at least one p channel in an absorption region of the substrate when forming the at least one p channel in the p-well of the FET;
    forming at least one n channel in the absorption region of the substrate when forming the at least one n channel in the p-well of the FET.

2. The method of claim 1, wherein the substrate comprises GaAs.

3. The method of claim 1, wherein the FET comprises a metal semiconductor field effect transistor (MESFET).

4. The method of claim 1, wherein the p-i-n photodetector and FET are formed as lateral structures.

5. The method of claim 1, wherein forming the n channel in the p-well and the absorption region further comprises:

implanting an n– type dopant in the p-well and absorption region after forming the p channel in the p-well and absorption region; and implanting an n+ type source and drain region in the p-well and the absorption region after implanting the n– type dopant.

6. The method of claim 5, further comprising:

implanting an n– type lightly doped drain into the n channel of the p-well and the absorption region after implanting the n– type dopant and before implanting the n+ type source and drain region.

7. The method of claim 5, wherein forming the n channel in the p-well and the absorption region further comprises:

implanting an n– type dopant in the p-well and the absorption region to form initial n channels therein after forming p channels in the p-well and absorption region;

depositing metal gates above the p-well after implanting the n– type dopant, wherein the gate metal divides the n channel in the p-well into two n channels; and implanting a heavy n+ source and drain region into the two n channels in the p-well and the absorption region after implanting the n type dopant.

8. The method of claim 1, wherein multiple interconnected p channels and n channels are formed in the absorption region, further comprising:

depositing a metal in a portion of the interconnected p channels and the n channels in the absorption region.

* * * * *